US006784500B2

(12) United States Patent
Lemkin

(10) Patent No.: US 6,784,500 B2
(45) Date of Patent: Aug. 31, 2004

(54) HIGH VOLTAGE INTEGRATED CIRCUIT AMPLIFIER

(75) Inventor: Mark Alan Lemkin, El Cerrito, CA (US)

(73) Assignee: Analog Devices, Inc., Norwood, MA (US)

( * ) Notice: Subject to any disclaimer, the term of this patent is extended or adjusted under 35 U.S.C. 154(b) by 17 days.

(21) Appl. No.: 09/944,830

(22) Filed: Aug. 31, 2001

(65) Prior Publication Data

US 2003/0071686 A1 Apr. 17, 2003

(51) Int. Cl.[7] .............................................. H01L 29/76
(52) U.S. Cl. ........................ 257/368; 257/20; 257/24; 257/27; 257/192; 257/213; 257/337; 330/253
(58) Field of Search .......................... 257/20, 24, 27, 257/133–145, 192–195, 202–211, 213, 252–413; 330/253

(56) References Cited

U.S. PATENT DOCUMENTS

| | | | |
|---|---|---|---|
| 4,170,740 A | | 10/1979 | Pernyeszi |
| 4,366,446 A | | 12/1982 | Henderson et al. |
| 4,453,134 A | | 6/1984 | Pernyeszi |
| 4,697,155 A | | 9/1987 | Lehning |
| 5,328,862 A | * | 7/1994 | Goo ............................ 438/289 |
| 5,341,333 A | * | 8/1994 | Tien et al. .............. 365/189.06 |
| 5,389,892 A | * | 2/1995 | Embree ....................... 330/253 |
| 5,426,396 A | * | 6/1995 | Bee ............................. 330/253 |
| 5,502,009 A | * | 3/1996 | Lin ............................. 438/275 |
| 5,504,444 A | | 4/1996 | Neugebauer |
| 5,745,008 A | | 4/1998 | Luong et al. |
| 6,018,267 A | * | 1/2000 | Tran et al. .................... 330/253 |
| 6,187,657 B1 | * | 2/2001 | Xiang et al. ................. 438/596 |
| 6,265,941 B1 | * | 7/2001 | Lopata ........................ 330/258 |
| 6,278,326 B1 | * | 8/2001 | Murray et al. ............... 330/288 |
| 6,356,153 B1 | * | 3/2002 | Ivanov et al. ................ 330/253 |
| 6,362,508 B1 | * | 3/2002 | Rasovsky et al. ........... 257/369 |
| 6,411,751 B1 | * | 6/2002 | Giles et al. .................... 385/16 |
| 2002/0135410 A1 | * | 9/2002 | Pullela et al. ................ 327/185 |

OTHER PUBLICATIONS

Deleonibus, S., et al., Field Transistors Electrical Behaviour in Double Level Aluminum Interconnect Procese VLSI Multilevel Interconnection Conference, 1989, 6th Int'l IEEE, 1989, p. 507.

Dale, D.P.E., "Video Amplifiers for Video Display Units", Linear Analogue Circuits and Systems, IEE Colloquium in 1992, pp. 8/1–8/7.

Peterson, K.E., et al., "3–V MMIC Power Amplifier with Novel Bias Circuitry", Microwave Symposium Digest, 1991, IEEE MTT–S Int'l, 1991, pp. 823–826, vol. 2.

Degrauwe, M., et al., "Adaptive Biasing CMOS Amplifiers", IEE Journal of Solid–State Circuits, vol. SC–17, No. 3, Jun. 1982.

Declercq, M., et al., "TP 10.6: 5V–to–75V CMOS Output Interface Circuits", 1993 IEEE Int'l Solid–State Circuit Conference, Session 10/ High–Speed Communication and Interfaces/Paper TP 10.6.

Yamaguchi, T., et al., "Process and Device Design of a 1000–V MOS IC", IEEE Transactions on Electron Devices, vol. ED–29, No. 8, Aug. 1982.

(List continued on next page.)

*Primary Examiner*—David Nelms
*Assistant Examiner*—Andy Huynh
(74) *Attorney, Agent, or Firm*—Vierra Magen Marcus Harmon & DeNiro LLP

(57) ABSTRACT

A circuit including at least one low voltage input, at least one high voltage output, and a field transistor having a source, a drain and a control region. The circuit may comprise a high-voltage amplifier. In this embodiment, an electrical connection between the high-voltage output terminal and the field transistor control region, and an electrical connection between the input terminal and a second transistor. Various embodiments of the field transistor are described.

45 Claims, 12 Drawing Sheets

OTHER PUBLICATIONS

Rumennik, V., et al., "Integrated High and Low Voltage CMOS Technology", 1982 IEEE, IEDM 82, pp. 77–80.

Martin, R., et al., "NMOS Driver with Active Outputs", 1983 IEEE, IEDM 84, pp. 266–269.

Zahir, P., et al., "Modeling and Characterization of CMOS–Compatible High–Voltage Device Structures", IEEE Transactions on Electron Devices, vol. ED–34, No. 11, Nov. 1987.

Ludikhuize, A.W., "High–Voltage DMOS and PMOS in Analog IC's", 1982 IEEE, IEDM 82, pp. 81–84.

Meyer, W.G., et al., "Integrable High Voltage CMOS: Devices, Process Application", 1985 IEEE, IEDM 85, pp. 732–735.

* cited by examiner

HIGH VOLTAGE INTEGRATED CIRCUIT AMPLIFIER

BACKGROUND OF THE INVENTION

1. Field of the Invention

The invention is directed towards a device for high-voltage amplification.

2. Description of the Related Art

High voltage amplifiers (i.e. amplifiers having a voltage swing of greater than about 40–60V) typically require a highly specialized circuit technology to withstand substantial voltage differences. These technologies include double-diffused MOS (DMOS), high voltage MOS (HVMOS) transistors, and high-voltage bipolar transistors referred to herein as high voltage transistors.

A DMOS or HVMOS typically includes at least four terminals: drain, gate, source, and bulk, with the bulk often tied to the source of the transistor. Typical DMOS and HVMOS transistors are engineered to withstand a large voltage between the drain and any of the other terminals. The other terminals are not designed to withstand such large voltages. In particular, the gate of a high voltage MOS transistor typically cannot withstand more than approximately 30V with respect to the source. In addition, high voltage transistors are typically very large in comparison to low voltage devices, since they must allow large distances for high-voltage-induced depletion regions to span.

High voltage amplifiers are useful in applying electrostatic actuation in optical switching arrays, optical beam steering, optical displays, disk-drive head actuators, other actuators, and electron-beam steering for a cathode-ray tube. A well-controlled high voltage amplifier is particularly important for attaining stable and accurate electrostatic actuation, since capacitors used for electrostatic actuation have a force dependent on the square of the voltage across their terminals.

In the aforementioned applications of high voltage amplifiers, it is useful to have an amplifier which is able to provide a well-regulated output voltage that is a multiple of a low-voltage input. The low-voltage input may be derived using low-voltage circuits. Since electronic devices have poor control over parameters such as output resistance and transconductance, a well-controlled, or voltage-stabilized, output voltage requires voltage feedback from the output terminal. However voltage feedback using known devices and methods is lacking. For example, as described above, high voltage transistors are normally large and their gate generally cannot withstand more than about 30V. Hence, switched capacitor techniques are unwieldy with high voltage transistors, and lack the performance that they attain at lower voltages. Resistive feedback, while another option, results in large power dissipation, since power dissipation is proportional to the voltage squared. To reduce power consumption to a level appropriate for highly integrated devices (including optical mirror arrays), resistors may be made large (on the order of tens of Mega Ohms). However, large resistors mandate that closed-loop bandwidth be reduced to maintain stability, since parasitic capacitances will conspire with these large resistances to form low frequency poles. In addition, large-valued resistors are big and diffusion resistors, typically the only resistive elements available that can form a large-valued resistor in a practical amount of space, are poorly controlled over temperature. Furthermore, depletion regions present in diffusion resistors will vary significantly over the operating range causing large nonlinearities. Diffusion resistors also suffer from junction leakage; caution must also be exercised to ensure that reverse-biased junctions do not break down. Hence, it is difficult to manufacture small integrated circuit devices using large resistors.

SUMMARY OF THE INVENTION

The present invention, pertains to a unique high voltage amplifier. In contrast to prior art high-voltage amplifiers, the invention described herein uses field transistors to obtain a well characterized and stable voltage transfer characteristic, with a minimal amount of power consumption, in a small area. In addition to low power consumption and small footprint, the inclusion of field transistors for voltage feedback typically will require no process modification, since parasitic field transistors are created in standard CMOS technologies.

The invention finds particular applicability in driving optical mirror arrays and other applications where a stable, high voltage amplifier controlled by a small input voltage is required.

The invention, roughly described, comprises a circuit which, in one embodiment, includes at least one low voltage input, at least one high voltage output, and a first field transistor having a source, a drain and a control region, wherein said control region is connected to said high voltage output.

In a further embodiment, the invention comprises a high-voltage amplifier. In this embodiment, the invention includes an input terminal, a high-voltage output terminal, a first field transistor having a gate a source and a drain, a second field transistor having a gate a source and a drain, an electrical connection between said high-voltage output terminal and said first field transistor gate, and an electrical connection between said input terminal and said second field transistor gate. Various embodiments of the field transistor are described.

In a further embodiment, the field transistors are provided at different sizes, wherein the size ratio of the transistors is proportional to the gain of the amplifier.

In yet another embodiment, the high voltage amplifier includes a transimpedence stage, comprising an output voltage responsive to an input current which may be single-ended or differential.

In a still further embodiment, a current differencing circuit is provided, and is coupled to the drain of said first field transistor. In this embodiment, the current differencing circuit is coupled to a trans-impedance stage providing a voltage output to an output terminal. The invention may further include a difference current amplifier having at least one transistor mirroring and amplifying the difference current in said amplifier.

In another embodiment, the invention comprises an integrated circuit including a high voltage amplifier circuit. The high voltage amplifier includes a high voltage core having a first terminal and a second terminal, a common mode feedback circuit and a differential mode feedback circuit. The common mode feedback circuit includes a first field transistor and a second field transistor, each transistor having a control gate, the control gate of the first field transistor coupled to said first terminal and said control gate of said second field transistor coupled to said second terminal, respectively. The differential mode feedback circuit includes a differential input and a third field transistor and a fourth field transistor, each transistor having a gate, the gate of said third field transistor coupled to said first terminal and said gate of said fourth transistor coupled to said second terminal.

In a still further embodiment, the invention comprises an optical mirror array, including at least one MEMS mirror and a high voltage amplifier on an integrated circuit.

These and other objects and advantages of the present invention will appear more clearly from the following description in which the preferred embodiment of the invention has been set forth in conjunction with the drawings.

BRIEF DESCRIPTION OF THE DRAWINGS

The invention will be described with respect to the particular embodiments thereof. Other objects, features, and advantages of the invention will become apparent with reference to the specification and drawings in which:

FIG. 1b is a plan view of the field transistor of FIG. 1a.

DETAILED DESCRIPTION

Several embodiments of a high voltage amplifier are disclosed herein. Each embodiment makes use of field transistors to provide a high voltage output on the gate of the transistor which can be controlled by a low voltage input.

Figure 1A:
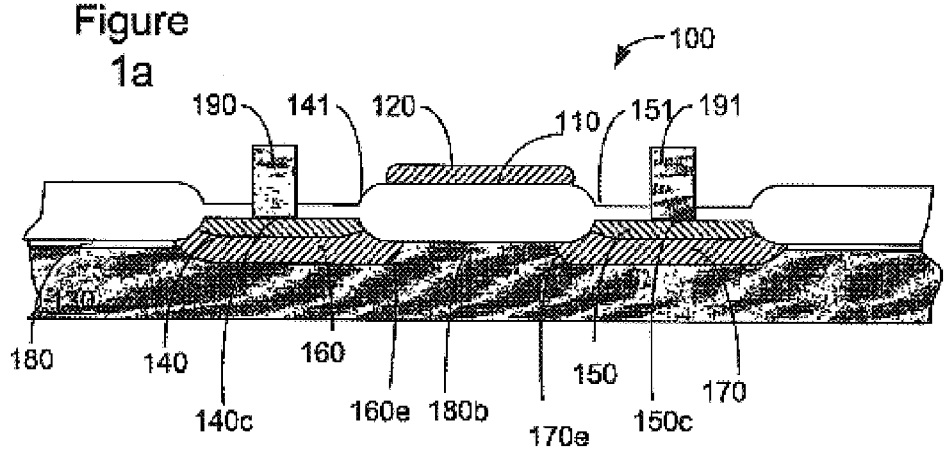
FIG. 1a is a sectional view of a field transistor formed in accordance with the present invention.
Figure 1B:
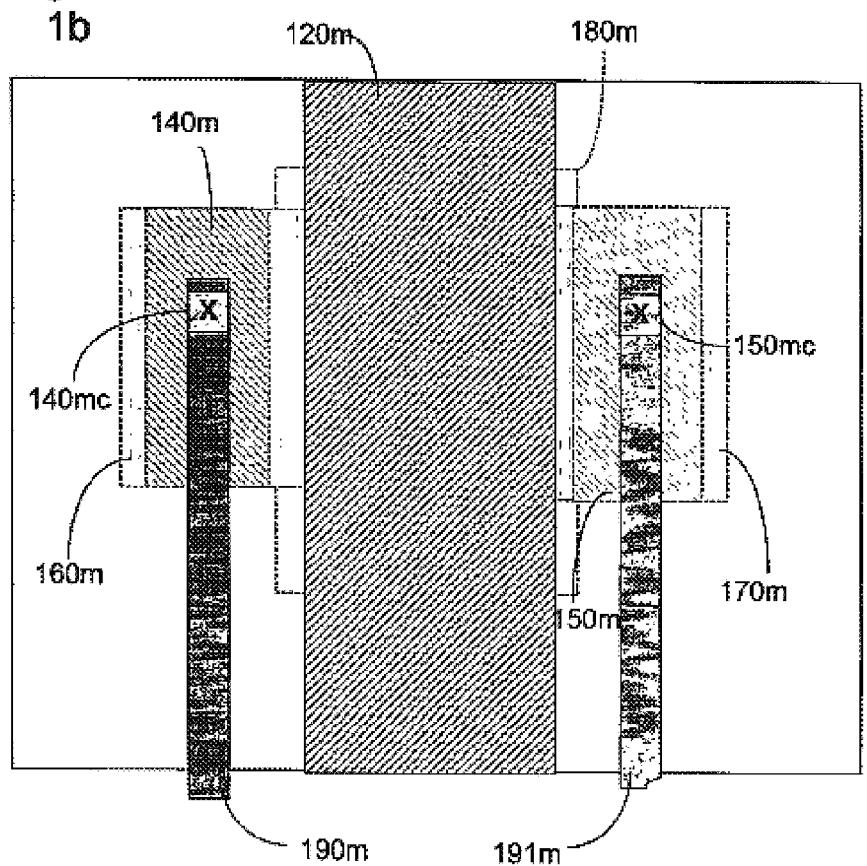

FIGS. 1a and 1b show a cross-sectional view and a plan view, respectively, of one embodiment of a field transistor 100 formed in accordance with the present invention.

A field transistor is defined, within the scope of this disclosure, as a field-effect transistor having a gate oxide thicker than the maximum gate oxide used for low voltage field-effect transistors in an integrated circuit device and operable within a triode region when proper voltages are applied to the gate, drain and source. A low voltage field-effect transistor is a transistor designed to withstand no more than 20V on a gate oxide. Furthermore, a field transistor, for purposes of definition within this disclosure, has a gate oxide thick enough to withstand a gate to source voltage in excess of about 40 Volts without breaking down.

In the context of this disclosure, field-transistors typically have a gate oxide greater than 0.5 microns, but may be as thin as 0.1 microns. Field transistors may be constructed using either a polysilicon or metal gate layer deposited over a thick, grown, thermal oxide. Many existing CMOS technologies include a LOCOS-based oxidation step in which a thick oxide is grown from a silicon wafer surface in defined areas; field transistors may be formed on this thick oxide formed during LOCOS. An excellent overview of well-known integrated circuit and CMOS processing techniques and well-known fabrication processes may be found in the three volume series: Wolf, S., R. N. Tauber, *Silicon Processing for the VLSI Era: Volume 1 Process Technology*, Lattice Press, Sunset Beach Calif., 1986; Wolf, S., *Silicon Processing for the VLSI Era: Volume 2 Process Integration*, Lattice Press, Sunset Beach Calif., 1990; Wolf, S., *Silicon Processing for the VLSI Era: Volume 3 The Submicron MOSFET*, Lattice Press, Sunset Beach Calif., 1995. Note that a field transistor may be formed on top of either the native substrate material or a tub or well of similar or opposite doping type to the native substrate material. Alternative configurations, not using a LOCOS-based gate oxide for example, include a metal gate transistor in which the metal gate is formed over an active region, but includes a thick, depositied oxide layer (deposited as a pre-metal dielectric after poly deposition) above the active region; a metal gate transistor in which the metal gate is formed over a deposited oxide which lies upon a LOCOS oxide; a poly or metal gate transistor in which the gate is formed on top of an additional thermally-grown oxide thicker than the thickest low voltage gate oxides available on chip through an additional oxidation step. It should be understood that there are many ways of forming a field transistor and that the precise method of forming and constitutive materials of the field transistor should not be limited to the exemplary structures described above. While an advantage of the present invention is that in most cases a field transistor may be formed using existing implanted layers and thermally grown oxides, it should also be clear that separate implant or masking layers (for example to effect a field threshold adjust, or source/drain extension layers) or separate gate oxide growth steps may be added to an existing process flow to form field transistors.

FIG. 1a shows one embodiment of a PMOS field transistor in accordance with the present invention. FIG. 1b shows a simplified diagram of mask layers of one particular layout of a field transistor 100. In this embodiment, the transistor structure is formed over a field oxide region 110 such as one which may be formed using a LOCOS (LOCal Oxidation of Silicon) or SILO (Sealed-Interface Local Oxidation) process, for example. In this particular embodiment of a field transistor, the gate 120 (defined by mask data 120m) comprises a polysilicon conductor deposited on a LOCOS oxide 110. Oxide 110 is physically defined by regions where a protective nitride layer (formed on a pad-oxide layer to reduce stress-effects in subsequently-formed low-voltage transistors) is absent during LOCOS oxidation. The gate oxide is a thermally-grown oxide (formed, for example, during a LOCOS step at 1100 C. in steam for approximately 4.5 hours) having a thickness of 1.5 µm. Substrate 130 is 10 Ohm-cm <100> n-type silicon, the source 140 and drain 150 implants are p+ boron implants (Defined by mask data 140m and 150m —a combination of active and p+ select). Source/drain extension areas 160, 170 are formed from diffused P-wells (defined by mask data 160m 170m —pwell). Metal conductors 190, 191 make contact to the source and drain regions by contacts 140c and 150c (metal conductors defined by mask data 190*m* 191*m* and contacts defined by mask data 140*mc* and 150*mc*). A field threshold adjust block region 180*b* (defined by mask data 180*m*) is also shown. In this embodiment of a field device, the field threshold adjust block region 180*b* blocks channel-stop implants (in this case arsenic, or an n-type dopant) intentionally introduced to raise the field threshold voltage of parasitic transistors. The channel-stop implant is typically used to prevent parasitic field transistors from being turned on in low-voltage portions of circuits, regions 180 for example. In an alternative embodiment, the field block region is not present and the PMOS field threshold is equal to the field threshold of transistors in the low-voltage portions of circuits. In yet another embodiment, implantation of a p-type dopant may be added to region 180*b* to lower the magnitude of the field threshold of the PMOS field transistor, or make the transistor into a depletion-mode device.

It should be noted that to maintain a high breakdown voltage in this field transistor, the active area edges 141 and 151 are spaced several microns from the edge of the gate 120. Because well-implant typically occurs before LOCOS formation, source/drain extension areas 160*e* and 170*e* are easily constructed using a standard p-well diffusion. Extension regions 160*e*, 170*e* help ensure that control gate 120 can form a conductive channel that stretches from the source to the drain, uninterrupted. A complementary field transistor may be constructed by reversing the polarity of the dopant types and changing the polarity of the local substrate through well/tub implants. When a source/drain extension implant is unavailable in a particular process, an additional implant step may be added in the process of forming the transistor in order to fabricate a device with the correct device polarity. Alternatively, the area between the active edge and the gate may be minimized and the fringing fields from the gate may be used to turn on the field transistor; however the performance of a device constructed in this fashion may be inferior. In yet another embodiment, existing implants such as Nfield (PMOS channel-stop) or Pfield (NMOS channel-stop) may be used as source-drain extension areas: i.e. for an NMOS device, formed in a pwell, source drain extension areas may be formed from PMOS channel-stop (n-type dopant). As described above, a field transistor may also be constructed using a metal gate with a deposited interlayer or pre-metal dielectric (ILD or PMD) between the metal gate and an active region wherein the active region comprises a thin, thermally-grown gate oxide. Standard n+ or p+ (as appropriate) implants used for low-voltage transistor source/drain implant may, in this case, be used to form a source-drain extension region for the field transistor.

Field devices formed in accordance with the foregoing description and having a structure as outlined in FIGS. 1*a* and 1*b* are used in embodiments of a high voltage amplification apparatus as discussed herein. In the context of the invention, embodiments may be described with respect to a particular construction as NMOS or PMOS. It should be recognized that the particular technology used to fabricate a particular device is described by way of example and complementary devices may be used in each instance of an NMOS or PMOS device.

Figure 2A:
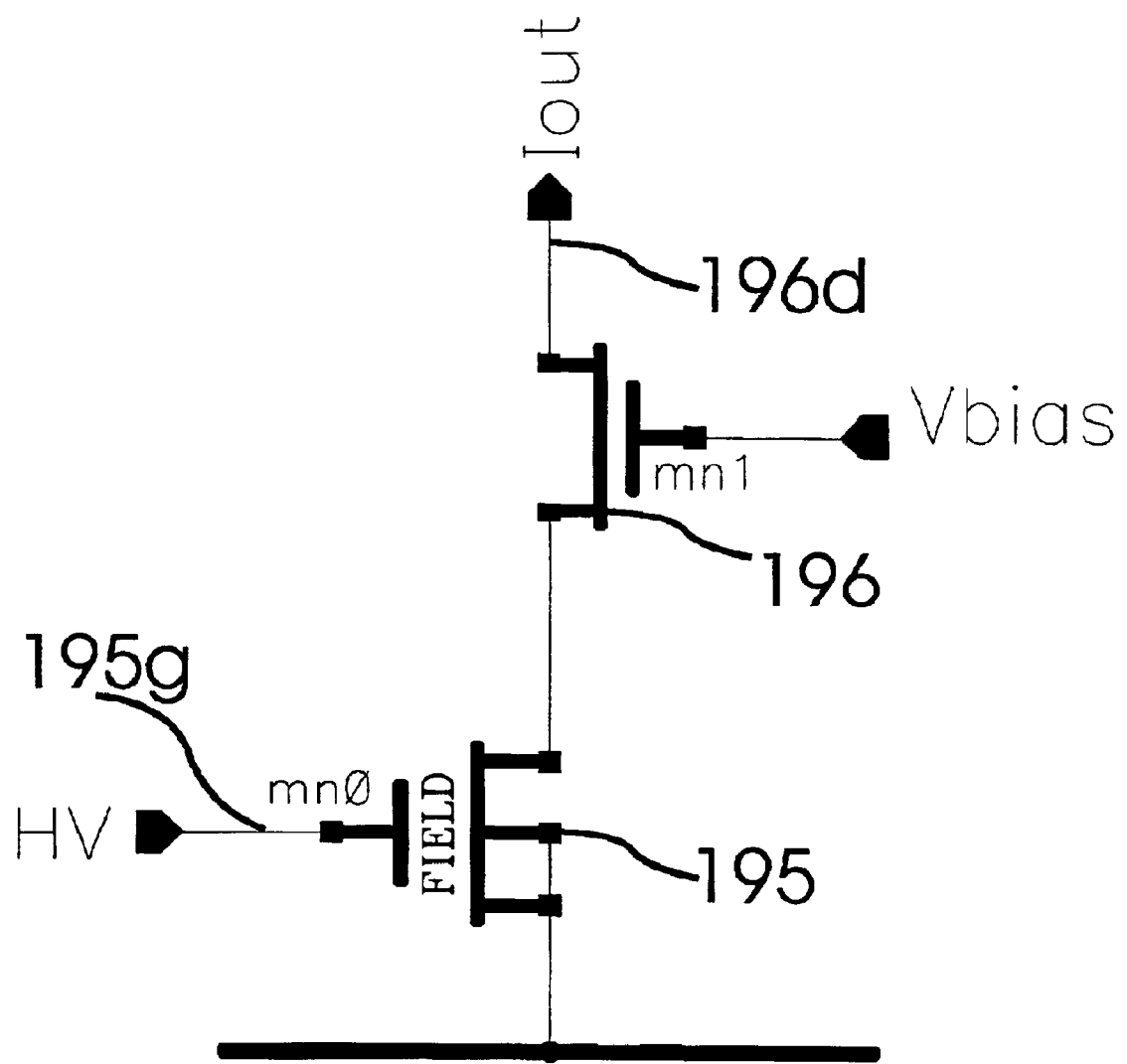
FIG. 2a is a schematic diagram of a first embodiment of the invention.

FIG. 2 shows a first embodiment of the invention. A single NMOS field transistor 195, formed in a complementary manner to the PMOS field transistor shown in FIG. 1*a*, has a high-voltage terminal 195*g* and is cascoded by low voltage NMOS transistor 196. A bias voltage $V_{Bias}$ is applied to the gate of transistor 196, causing a substantially constant voltage to appear across the drain and source of transistor 195. Assuming that the conductance of transistor 196 is substantially larger than the conductance of transistor 195, field transistor 195 is in triode. Thus, for voltages $V_{HV}$ applied to terminal 195*g* an output current appears at terminal 196*d* approximated by:

$$I_{out} \approx \mu C_{ox}\left(\frac{w}{l}\right)(V_{HV} - V_{T195})(V_{Bias} - V_{T196})$$

where $V_{T196}$ is the threshold voltage of transistor 196, $V_{T195}$ is the threshold voltage of transistor 195, and w, l, $\mu$, and $C_{ox}$ are the width, length, mobility and capacitance per unit area of transistor 195, respectively. Note that the output current of transistor 195 is proportional to the input voltage $V_{HV}$, and thus may be used to sense a high voltage in a small area using devices found in a standard CMOS process and drawing small amounts of power. The output current may be connected to a transimpedance stage, (such as a resistor or, alternatively, an opamp placed in negative feedback with a resistor between the negative input terminal and the output terminal), to obtain an output voltage representative of the high-voltage input.

Figure 2B:
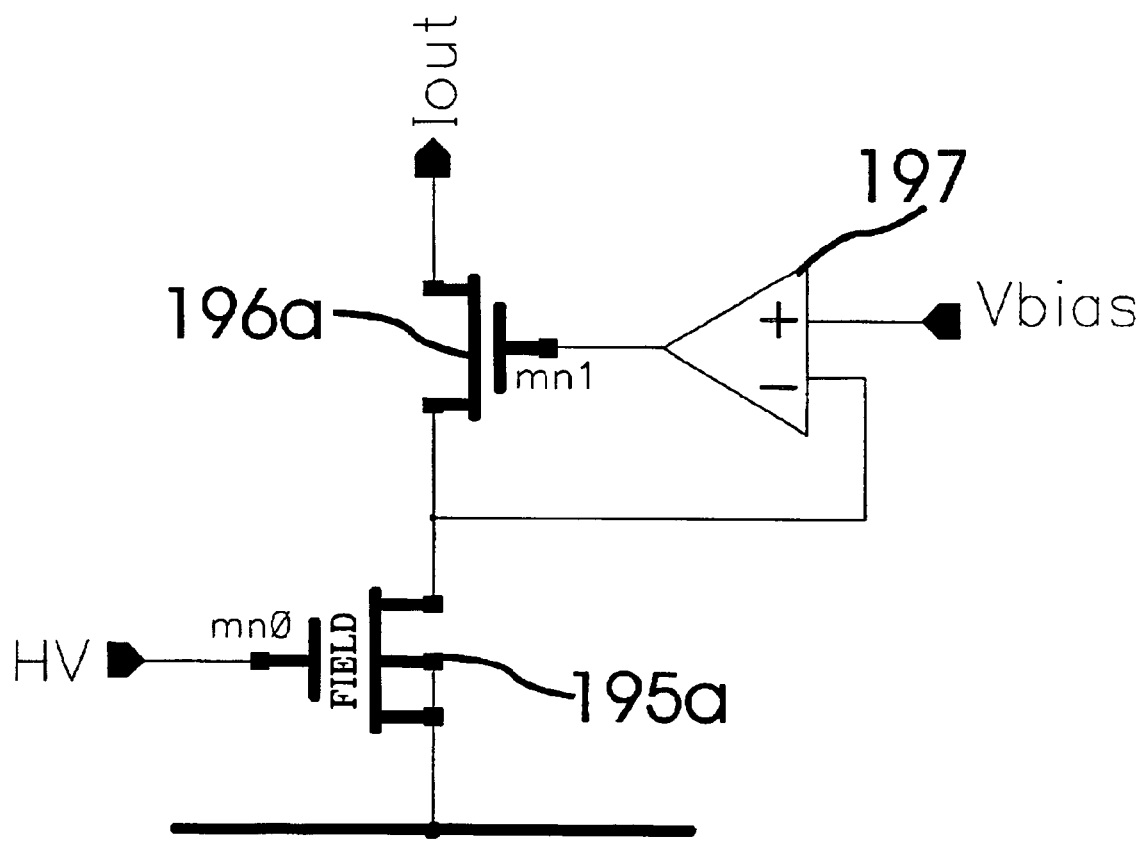
FIG. 2b is a schematic diagram of a second embodiment of the invention including an operational amplifier.

FIG. 2B shows a second embodiment of the invention. The second embodiment of the invention differs from the first embodiment of the invention in that an operational amplifier 197 provides feedback to keep the drain of field transistor 195*a* at a constant voltage equal to $V_{Bias}$. Use of feedback to regulate the drain voltage of transistor 195*a* makes the drain-source voltage of transistor 195*a* substantially independent of the output current. Note that amplifier 197 is similar to those commonly used in conventional gain-boosting techniques for low-voltage, high-gain transconductance amplifiers (See, for example, Holzmann, P. J, et al., "A low-offset low-voltage CMOS op amp with rail-to-rail input and output ranges," ISCAS '96, pp.179–82).

Figure 3:
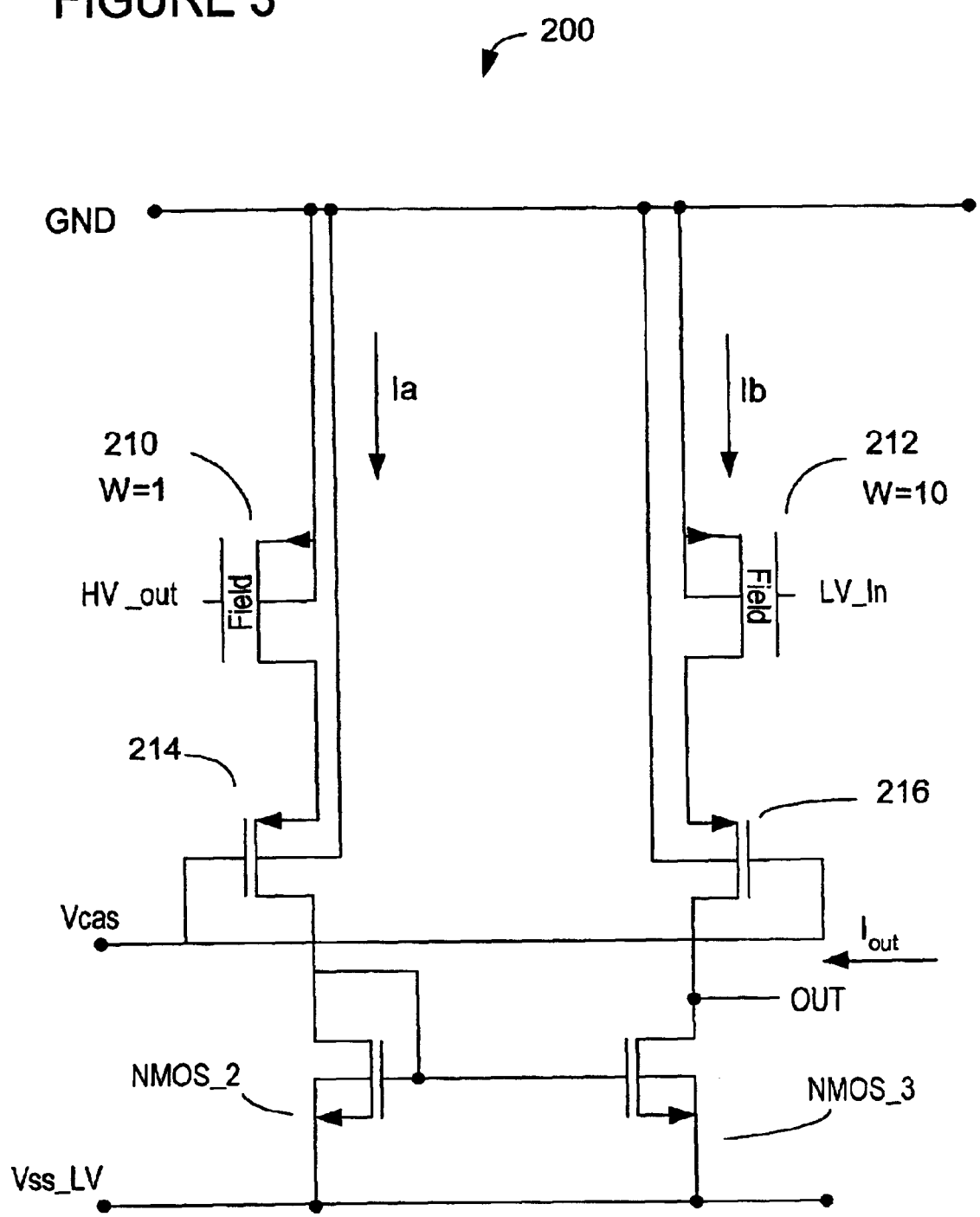
FIG. 3 is a schematic diagram of an amplifier formed in accordance with the present invention.

FIG. 3 shows a third embodiment of the invention, that of a differential amplifier formed with field transistors. In the third embodiment, two PMOS field transistors 210, 212 are shown as having sources connected to a positive rail (GND). Their backgate terminals are coupled to the positive rail as well. Each device is cascoded by a transistor 214, 216 (i.e. a BJT or FET), or alternatively through a transistor in conjunction with a feedback circuit as described in the second embodiment (not shown in FIG. 3).

The cascodes keep a substantially constant voltage between the drain and source terminals of each field device 210, 212. The cascode/field device circuit shown in FIG. 3 effects a source or emitter degenerated differential pair with the field devices 210, 212 acting as variable emitter/source degeneration resistors. The amount of current through each device 210, 212 is dependent on both the gate and the drain-to-source voltage. Current $I_a$ flowing on the high voltage side of the amplifier is mirrored to the output node by NMOS_2,3. Current $I_b$ flowing on the low-voltage side of the amplifier is added directly to the mirrored current, such that the output node (OUT) has a current of $(I_a-I_b)$. The output current may be coupled to a trans-impedance stage, or a common-gate or common-base amplifier to obtain a voltage output.

The difference current $(I_a-I_b)$ appearing at the output is representative of the differential resistance of the field devices 210, 212. Note that in this embodiment, the $V_{ds}$ across the field devices 210, 212 is typically on the order of only a few volts, placing devices 210, 212 in the triode region. Therefore, in the embodiment of the invention shown in FIG. 3, each field device approximates a variable MOS resistor.

As mentioned previously, it is often beneficial to have a high-voltage amplifier incorporate a well-controlled gain, so that the output voltage may be controlled by low-voltage calculation circuits (such as, for example, D/A converters). To obtain a well-controlled gain, the field transistors 210, 212 may be chosen to have different dimensions. For example, to obtain a gain of approximately 10V/V (i.e. a 10V input signal results in a 100V output signal), the width of the field device 210 connected to the high voltage side may be constructed to be, for example, approximately 10 times smaller than the width of the field device 212 connected to the low-voltage (or control) side. Hence, to obtain the equivalent resistance in both field devices (and thus, a balanced circuit), the gate voltage of the smaller field device must be made 10 times higher than the low voltage side since the output resistance is approximately equal to:

$$Ron \approx \frac{1}{\mu C_{ox}\left(\frac{w}{l}\right)(V_{gs}-V_T)}$$

For $V_{gs} >> V_{ds}$.
This provides the desired controlled high gain amplifier using a size differential of the field transistors.

Note that to first order, the output of the amplifier 200 described herein is insensitive to wafer to wafer variations in the mobility of electrons or holes in the oxide ($\mu_0$), the capacitance of the oxide ($C_{ox}$), as well as changes in these parameters over temperature, since gain is dependent on the ratio of the conductance of each device. To account for changes in threshold voltages, a $V_T$ reference may be used to generate a voltage proportional to the threshold voltage of the field device. This reference may be used to either adjust the voltage of the top rail, or adjust the input voltage to account for the field threshold voltage. Design of $V_T$—referenced voltage sources is well known by those skilled in the art.

In the circuit of FIG. 3, $V_{cas}$ is a bias voltage for PMOS transistors 214 and 216. In one embodiment, $V_{cas}$ is about −4 volts, $V_{sslv}$ is about −5 to −10V. Ground is at 0 v. In this embodiment, the field devices turn on with a gate voltage about −10 to −20 v below ground. Use of the thick oxide, field transistor device allows a high voltage to be applied to the gate of transistor 210.

In an alternate embodiment, the width and length of the field transistors 210 and 212 are made equal, and a gain is attained by ratioing the NMOS current mirror. For example in this embodiment, referring to FIG. 3, by setting the W/L of low-voltage NMOS_2 to 10 times greater than NMOS_3, a gain of approximately 10 may be effected.

As described earlier, the output (OUT) of this core 200 may be coupled through a current-input, voltage-output, high voltage output stage. An example of a circuit including the core and such an output stage is shown in FIG. 4a.

Figure 4A:
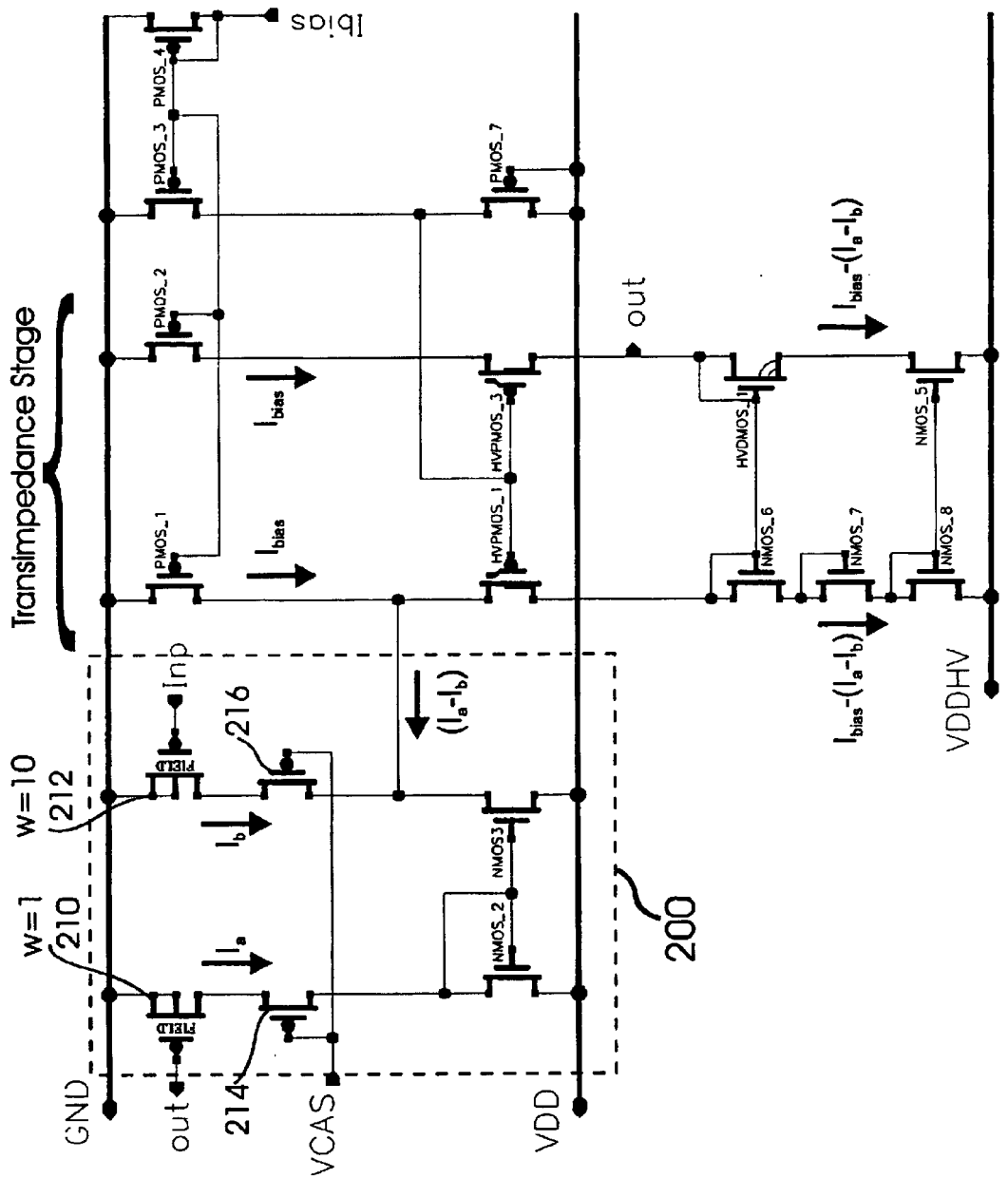
FIG. 4a is a schematic diagram of a second embodiment of the amplifier formed in accordance with the present invention.

In FIG. 4a, in a fourth embodiment of the present invention, a sample trans-impedance stage is shown coupled to the current output (OUT) of core 200. The output impedance at the drain of the transistor HVDMOS_1 sets the current-to-voltage gain of the trans-impedance portion of this stage. It should be noted from FIG. 3 that all devices shown therein are low voltage devices with the exception of field transistors 210, 212, high voltage PMOS transistors HVPMOS_1 and HVPMOS_3, and high-voltage DMOS transistor HVDMOS_1. The DMOS and HVPMOS devices are standard high-voltage transistors able to withstand up to 200V on their drain, but breaking down for gate-source voltages greater than about 40V. The lack of a need for a high-valued diffusion resistor and the minimal number of DMOS and HVPMOS devices needed for operation allows the amplifier shown in FIG. 4a to be made relatively small. By coupling the high-voltage output of the trans-impedance stage back to the gate of field transistor 210, a well-defined, voltage stabilized transfer function between Inp and Out is attained. This is in spite of the fact that the gain of the trans-impedance stage is poorly controlled and may vary significantly from device to device.

As shown in FIG. 4a, the trans-impedance stage comprises low voltage devices PMOS_1 coupled to HVPMOS_1 in series with low voltage transistors NMOS_6, NMOS_7 and NMOS_8, as well as PMOS_2 coupled in series with HVPMOS_3 and HVDMOS_1 and NMOS_5. HVDMOS_1 acts as a cascode, protecting the drain of low-voltage NMOS_5 from the large swings at the amplifier output. Transistors NMOS_6, NMOS_7 and NMOS_8 set up a bias voltage at the gate of HVDMOS_1, ensuring that NMOS_5 remains in saturation. A current mirror, formed from NMOS_8 and NMOS_5, mirrors the current $I_{bias}$—$(I_a-I_b)$ to the source of HVDMOS_1.

Figure 4B:
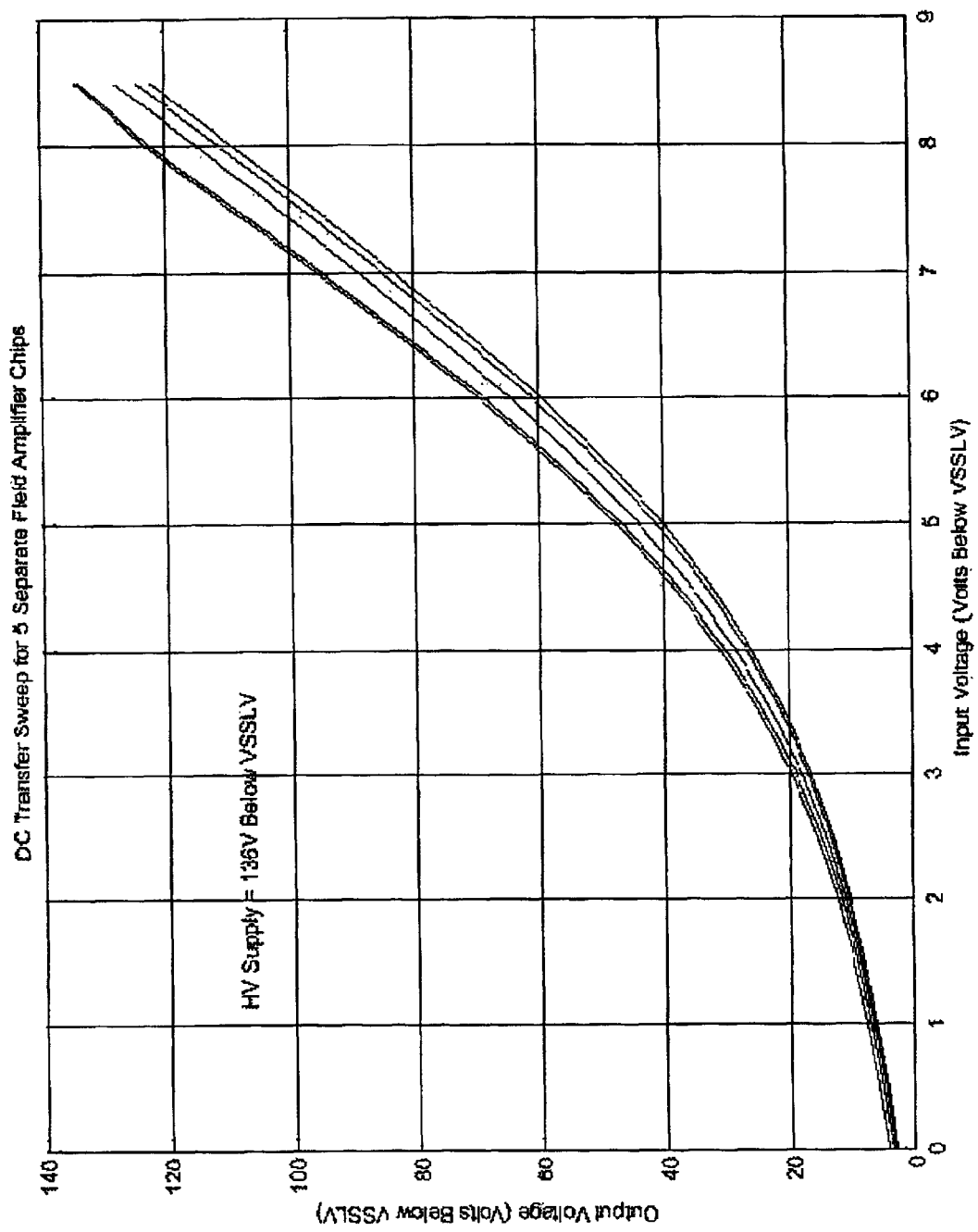
FIG. 4b is a DC transfer sweep showing experimental data of 5 separate field amplifier chips formed in accordance with the present invention.

A bias current $I_{bias}$ is sourced by PMOS_1 and PMOS_2, causing a quiescent current to flow in HVPMOS_1, HVPMOS_2, NMOS_5, NMOS_6, NMOS_7 and NMOS_8, and HVDMOS_1. Through the connection to core 200, the difference current $(I_a-I_b)$ is subtracted from the current mirrored from NMOS_8, to NMOS_5. Hence, a current output by core 200 causes a current to be sourced or sunk into the high-impedance output node thereby causing a change in voltage at the output set by the current multiplied by the effective output impedance. By feeding back the voltage at the output node to the gate of field transistor 210, a voltage-stabilized amplifier results. FIG. 4b illustrates measured experimental DC transfer sweep data taken from five amplifiers constructed in accordance with the schematic of FIG. 4a. From this plot the input referred offset variation is within about +/−0.25V. This indicates that the amplifier of the present invention will have good cross-wafer uniformity, allowing one to easily cancel wafer-to-wafer threshold variations. The scale factor is also very close for all 5 chips when the field devices are both in triode (|vin|>~5V) having a mean value of 22.7 V/V and all falling within +/−5% of this number.

Figure 5:
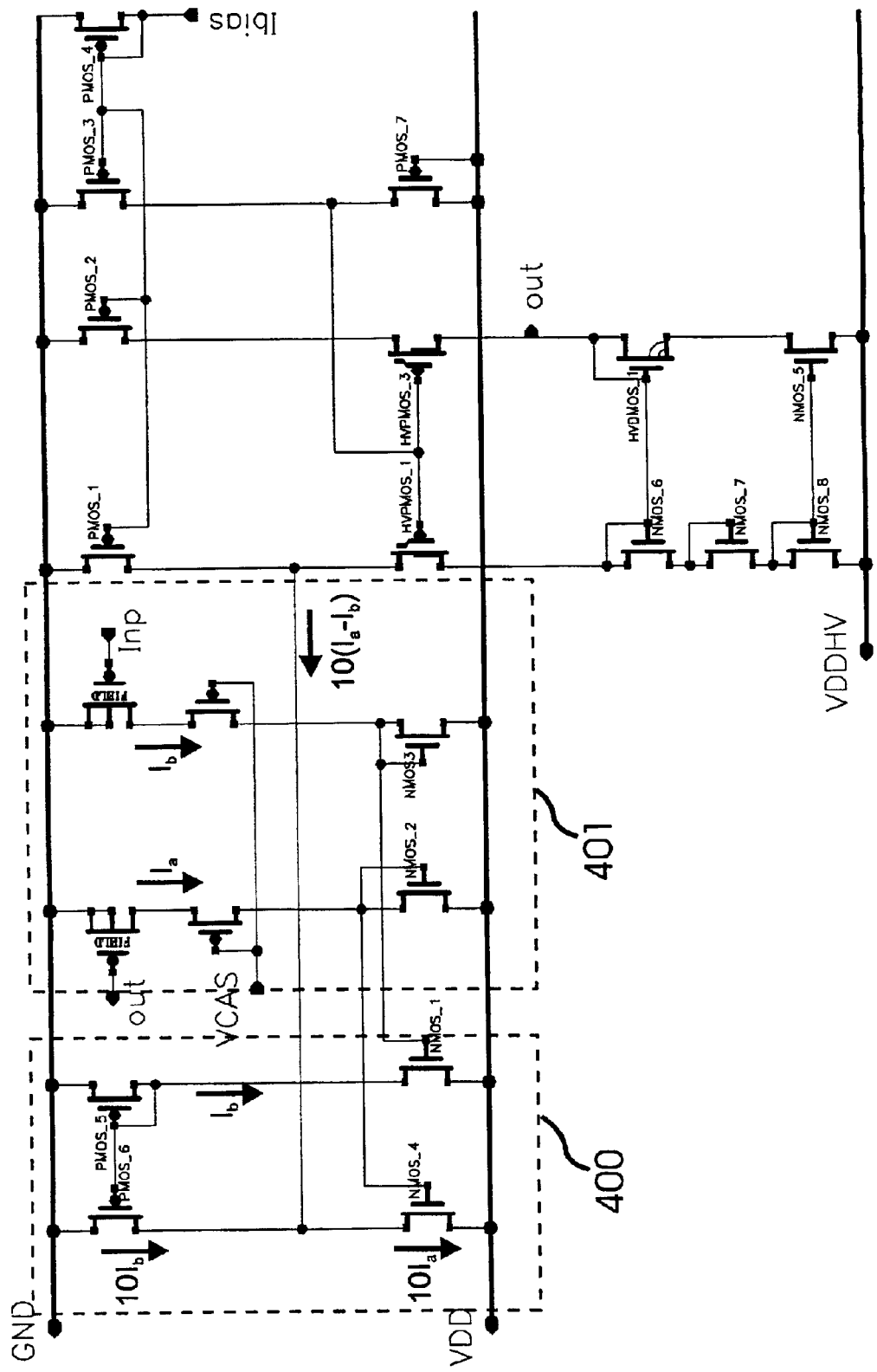
FIG. 5 is a schematic diagram of another embodiment of the amplifier of the present invention incorporating a gain and differencing stage.

A fifth embodiment of the present invention is shown in FIG. 5. To improve the effective transconductance of the amplifier core 200 shown in FIG. 3, a current differencer and amplifier is added to core 401 to increase bandwidth due to capacitive loading, to attenuate input-referred effects due to transistors located in the output stage, and to attenuate input-referred effects of output loading and leakage currents. Current differencing is performed at the output node of the front-end differencer/amplifier 400 to minimize static power consumption.

Front-end differencer/amplifier comprises PMOS_6, PMOS_5 and NMOS_4, NMOS_1. Inputs to stage 400 are from diode connected transistors NMOS_2 and NMOS_3 in core 401 The output to the trans-impedance stage now comes from the output of front-end stage 400. In FIG. 4, $I_a$ and $I_b$ are amplified and then differenced in stage 400. Two current mirrors provide a gain of 10 comprising transistors NMOS_2 and NMOS_4, and NMOS_3, NMOS_1, PMOS_5 and PMOS_6. Amplification of $I_a$ by 10 is attained by making the W/L of NMOS_4 10 times larger than NMOS_2. Amplification of $I_b$ by 10 is attained by making the W/L of PMOS_6 10 times larger than PMOS_5. Differencing of these two currents is accomplished by making 10 $I_b$ sourced into the same node that 10 $I_a$ is sunk.

Thus, the input to the high-voltage stack is a quantity representative of the difference between these two current sources equal to $10*(I_a-I_b)$ as shown in FIG. 5. Obviously, one skilled in the art will be aware of many other forms of well-known current manipulation techniques and the differencing/mirroring techniques described herein represent only one exemplary embodiment.

It should be recognized that the embodiment shown in FIG. 5 is not symmetric and one of average skill would understand that the addition of a second stage similar to stage 400 would make the system symmetric.

It should be further recognized that the device size for NMOS_4:NMOS_2 and PMOS_6:PMOS_5 indicated as 10x is exemplary and differential ratios other than 10:1 may be implemented in accordance with the present invention. In addition, the ratios need not be representative of physical device sizes. For example, each device could be formed of parallel-coupled transistors.

Figure 6:
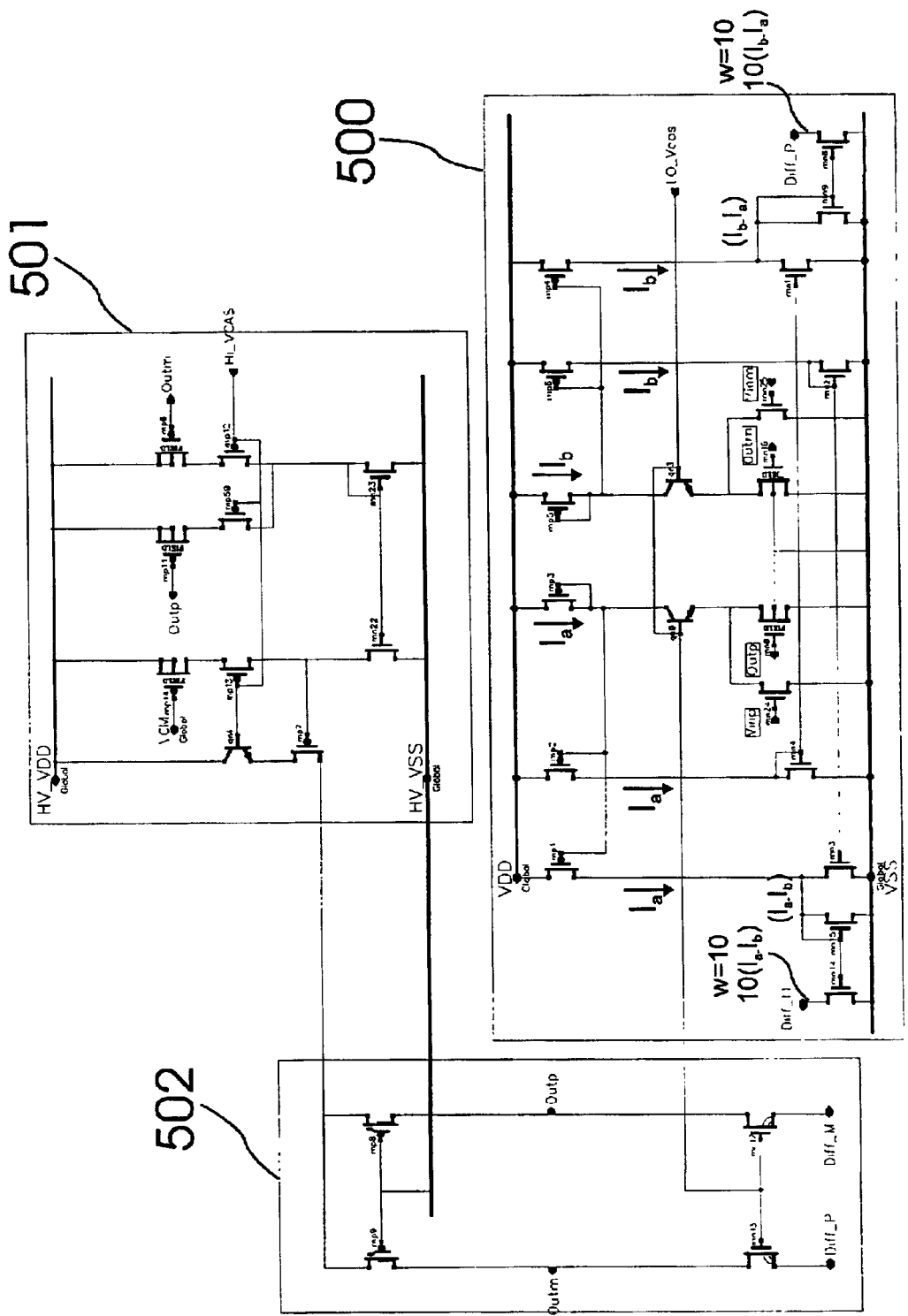
FIG. 6 is a schematic diagram of yet another embodiment of the invention incorporating an amplifier having both differential and common mode input control.

A fully-differential implementation of a high-voltage amplifier is shown in the embodiment of the invention illustrated in FIG. 6. This embodiment includes two-degree of freedom voltage control wherein the degrees of freedom may be decomposed to differential and common-mode components. Two-degree-of-freedom voltage control is useful, for example, in capacitive forcing where linear voltage-force dependence is desired, since applying voltages in this manner substantially attenuates the voltage-squared dependence of electrostatic force on voltage. Two-degree of freedom voltage control is attained using two feedback loops: a differential feedback loop to control the differential voltage at two output nodes $Out_p$ and $Out_m$, and a common-mode feedback loop to control the common-mode voltage. The differential voltage is defined as $Out_p-Out_m$, while the common mode is $(Out_p+Out_m)/2$.

The differential amplifier of FIG. 6 may be broken down into three conceptual blocks: differential feedback core 500, common-mode feedback core 501, and high-voltage stack 502. These conceptual blocks are now described in turn.

Differential core 500 stabilizes the voltage difference between the positive and negative output terminals. Core 500 comprises two input terminals responsive to voltage (Vinp and Vinm), and two output current terminals Diff_M and Diff_P. A differential output current equal to the current difference Diff_P–Diff_M is provided from four differencing transistors comprising: a pair of NMOS field transistors mn0, mn16 and a pair of low-voltage NMOS input transistors mn24 and mn25. the gates of mn0, mn16 are connected to $Out_p$ and $Out_m$, respectively. Low-voltage transistors mn24 and mn25 provide a differential resistance, controllable by the voltage on differential input voltage terminals $V_{inp}$ and $V_{inm}$. Bipolar transistors qn0 and qn3 set up a nominally equal and constant drain-source bias across mn0, mn16, and mn24 and mn25. Note that the current flowing through qn0 is approximately equal to the base voltage minus Vbe(qn0), divided by the resistance of mn0 and mn24 in parallel. The current flowing through qn3 is approximately equal to the base voltage minus Vbe(qn3) (again, nominally equal to the emitter voltage of qn0), divided by the resistance of mn16 and mn25 in parallel. Note that input devices mn24 and mn25 are usually operated in triode mode, thereby acting as variable resistors, although they may be operated in saturation for at least some portion of input voltages. Field transistors mn0, mn16 operate in triode region for output voltages of interest.

Operation of the differential feedback loop in response to an input signal is now described. To aid in explanation, it is assumed that the output voltages are equal immediately before application of a differential voltage to the input terminals. A differential input voltage is now applied to mn24 and mn25, these devices are operating in the triode region. Because the output voltages are equal, the on-resistance of the field devices are equal; thus the current flow through qn0 and qn3 will become unequal due to the different combined-parallel resistance between the resistance of the two branches comprising mn24 in parallel with mn0 and mn16 in parallel with mn25. This difference in combined-parallel resistance is due to the differential input applied to the input terminals, that causes a difference in the conductance between low-voltage NMOS transistors mn24 and mn25. PMOS transistors mp5 and mp3 sense the collector currents in qn0 and qn3. The current-differencer circuit, comprising mp1, mp2, mp4, mp6 and mn1, mn2, mn3, mn4, provide a difference current that is amplified and mirrored into terminals Diff_M and Diff_P by mn8, mn9, mn14, and mn15. Terminals Diff_P and Diff_M are cascoded by high-voltage DMOS transistors, effecting a transimpedance amplifier. The effect of the difference current Diff_P–Diff_M is to drive the differential voltages at Outp and Outm in a direction so that the effective resistances seen at the emitter of q0 and q3 (comprising the resistance of the field and low-voltage transistors in parallel) become equal. Equal resistance at the emitters of q0 and q3 (i.e. resistance of field and low-voltage NMOS in parallel) is attained by making the resistance of the field devices different thorough changing their gate voltage —or equivalently the output voltage. In this manner, the currents through mp3 and mp5 are driven to be equal, thereby reaching a steady state output voltage. Note that to first order, core 500 is common-mode independent, since if the resistances at the emitters of qn0 and qn3 are equal, there will be no current at Diff_M nor Diff_P—independent of the actual value of the resistance. The gain between input and output is primarily set by the difference in size and mu-Cox between the input and field devices.

Again, field transistors are acting as variable resistors controllable by a high-voltage terminal. In this embodiment, the capacitance of the gate oxide, $C_{ox}$, is much greater for the low voltage device since the gate-oxide thickness of the low-voltage transistor is less than the field transistor. Hence, if $C_{ox}$ of the low-voltage devices is 20× greater, and you make the devices the same size, the amplifier will have a gain of approximately 20.

Note that in this embodiment of the invention Diff_P and Diff_M can only sink current—thus whenever there is a differential change in output voltage, the difference is adjusted by pulling down the appropriate output terminal. In absence of common-mode feedback, this would cause a change in common-mode value.

Operation of common mode core 501 is now discussed. A common-mode reference voltage is supplied to terminal VCM, typically midway between the HV_VDD and VSS rails, but any voltage between these rails may be chosen. To understand the principle of operation, suppose the output common-mode voltage is equal to the voltage VCM when a differential voltage is applied to the input of differential core 500. The differential voltage causes differential core 500 to drain current from one or both terminals Diff_M, Diff_P to drive the parallel resistance at the emitters of qn0, qn3 equal. These currents are cascoded by the DMOS transistors mn12 and mn13 in HV stack 502 pulling down the appropriate side: $Out_p$ or $Out_m$. As described above, since Diff_P, Diff_M, in this embodiment, are only able to sink current a change in the output common-mode voltage will occur. Field transistors mp0 and mp11, which operate in triode, sense the common-mode voltage, and a current representative of the common-mode voltage is presented to mn23. An error current representative of the error between the measured and reference common-mode voltages is provided at the gate of mp7 providing an error voltage which causes mp7 to bleed in additional current through its drain into the HVPMOS stack comprising mp8, mp9 thereby bringing the common mode voltage toward the reference value. Thus, to first order, the feedback loop drives the output common-mode voltage to equal the reference voltage, sensing this condition when the resistance presented at the source of PMOS transistor mp14 equals the resistance of mp0 and mp11 in parallel—mp14 having twice the width of mp11 and mp0, which are of equal width (since the currents from cascode transistors mp12 and mp59 are added at the drain of mn23). In an alternative embodiment, the error current between the reference and sense field devices may be directly applied to the connected sources of the HVPMOS cascode comprising mp8, mp9, or amplified and fed into the HVPMOS cascode. In this embodiment, one measures the common mode by taking two single-width field transistors and measuring the average resistance as compared to a double-width field transistor connected to a reference. Alternatively, the double-width field transistor may comprise two single-width field transistors connected in parallel for better matching.

In the embodiment shown in FIG. 6, the differential and common-mode feedback loops are located about different rails: differential core 500 is located near VSS and common-mode core 501 is located near HV_VDD. By locating one feedback core at each rail the need for direct communication of feedback signals from bottom to top rails is eliminated, since feedback currents are calculated near, and sourced from, each rail. By separating the feedback cores in this manner, the need to mirror feedback currents at the opposite rail is removed, thereby reducing power consumption and eliminating the need for at least one more large high-voltage transistor.

The combination of the two cores 500, 501 comprises a coupled feedback loop, and the settling characteristics of the output to a change in a differential or common-mode setpoint will be affected by both the common-mode and differential-mode dynamics, as well as the coupling in between these two feedback loops.

Note that the differential amplifier may operate with field transistors that have a substantially higher field threshold than the low-voltage supply rails, since the input to the amplifier does not require turning on the field transistors—the input is coupled through the low voltage transistors.

Another advantage of this topology is that this class AB differential amplifier requires fewer high-voltage transistors per high-voltage output node, due to the communication of the output voltages to common-mode circuit located at the top rail by the field transistors. The present embodiment illustrates a circuit in which the differential core is located around the bottom supply rail, and the common-mode core is located around the top supply rail. It will be recognized that it is possible to provide a differential amplifier in which the common-mode and differential mode cores are located at the same rail (i.e. high or low-side), or the differential core is located at the high supply rail while the common-mode core is located at the low-side rail. Operation of same-side rail configurations in a class-AB fashion, however, may require the addition of more high-voltage transistors. Furthermore, it is not necessary to use bipolar junction transistors as the cascode device—qn0 and qn3 may be replaced with mosfets, for example.

Figure 7:
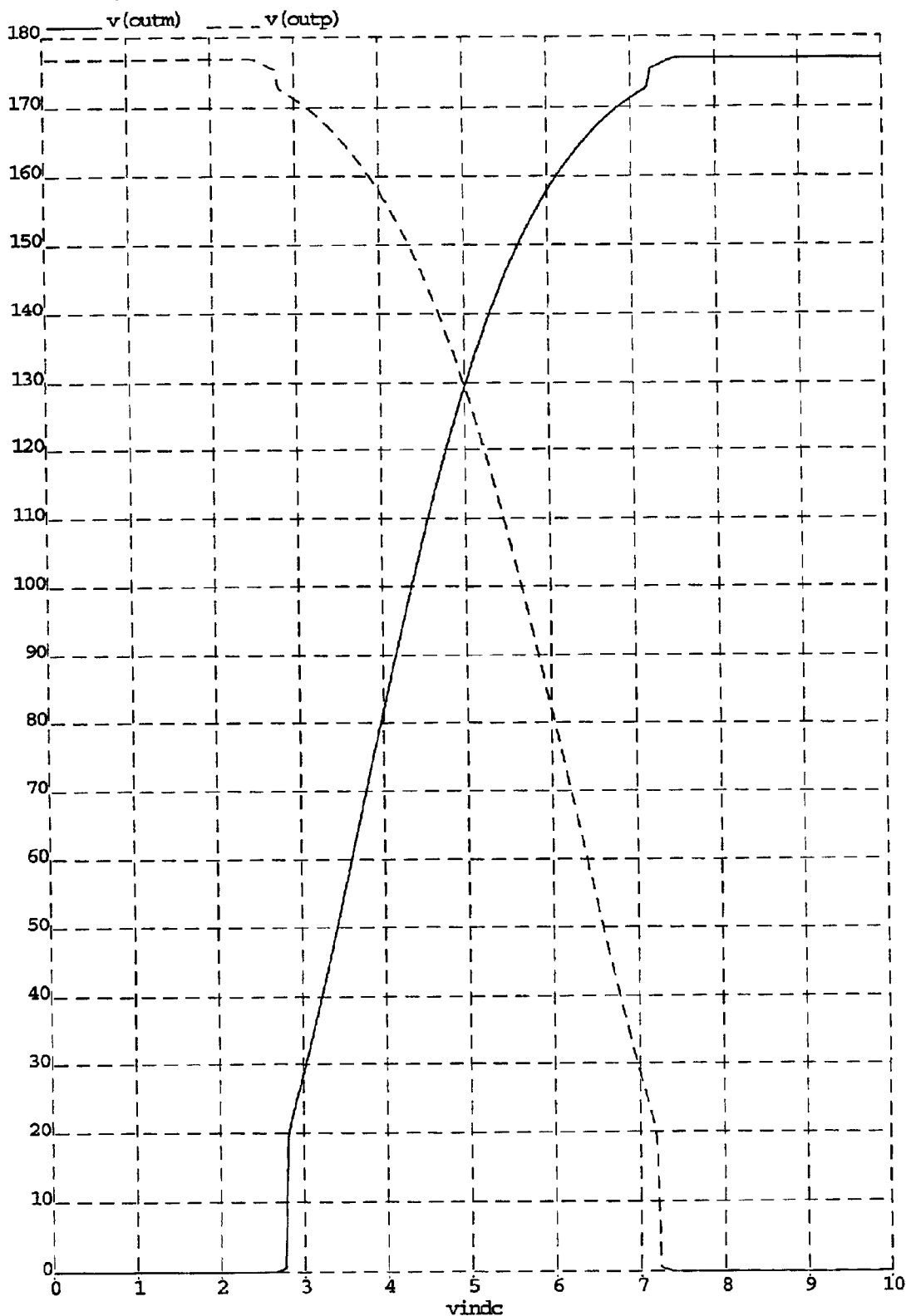
FIG. 7 is a graph showing output voltages as a function of input voltage for the embodiment of the present invention shown in FIG. 6.
Figure 8:
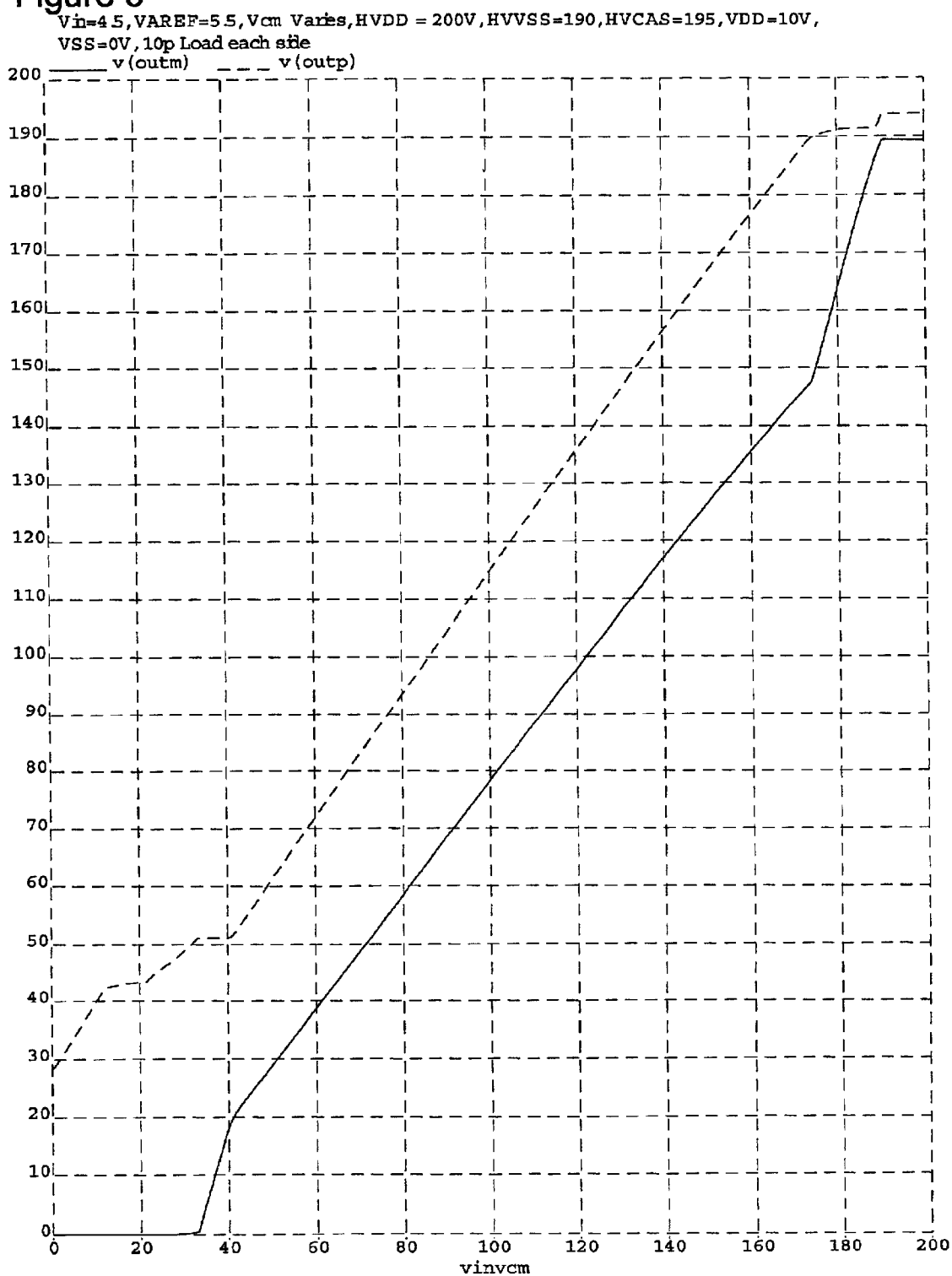
FIG. 8 shows the output vs. common-mode reference voltage VCM for the embodiment of the invention shown in FIG. 6.
Figure 9:
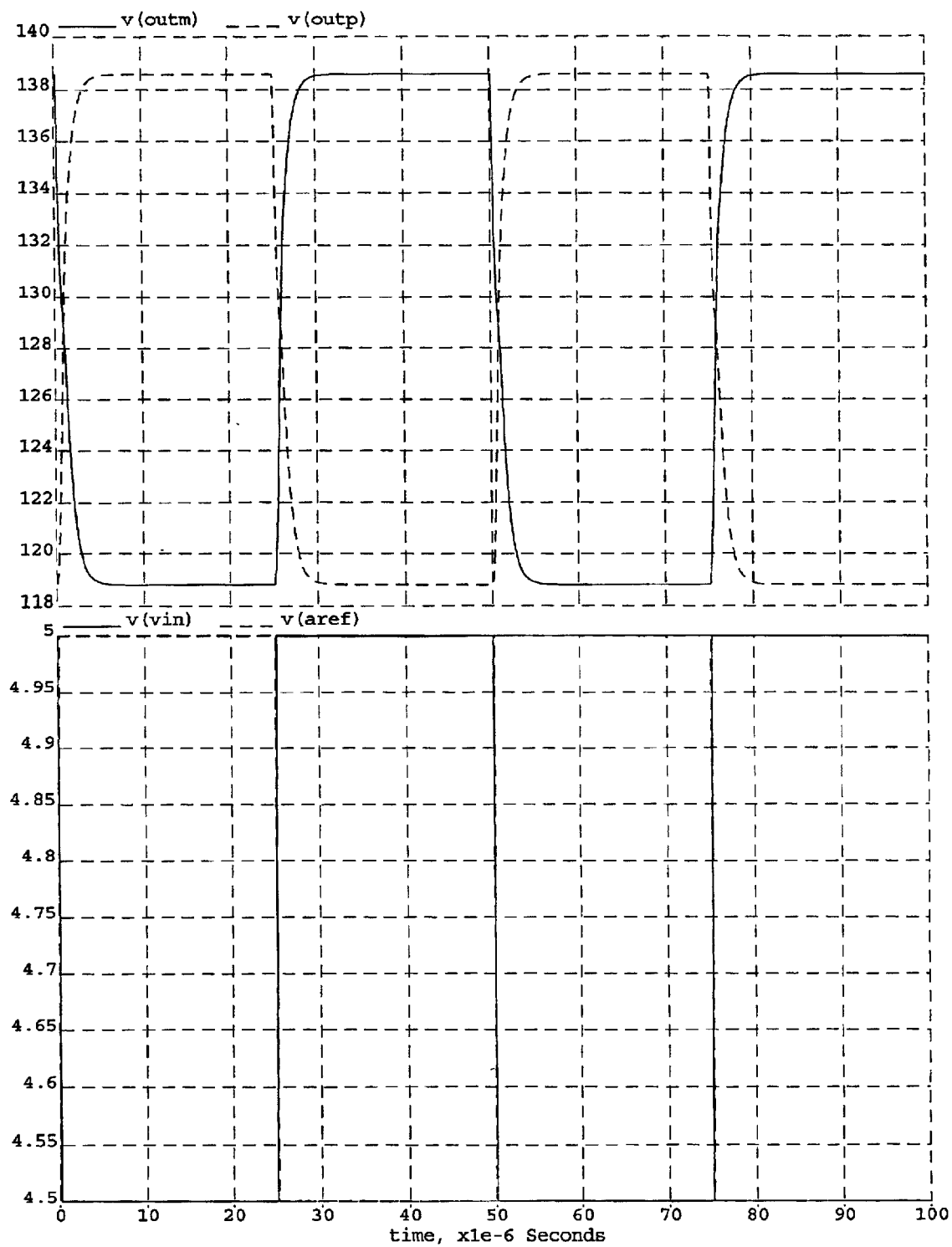
FIG. 9 shows the transient response of the output to a square-wave input voltage with a 10 pf load on each output terminal for the embodiment shown in FIG. 6.

FIGS. 7–9 show simulated results of the differential amplifier shown in FIG. 5. In these simulations the supply rails are: HV_VDD=200V, HV_VSS=190, Hi_VCAS=195, VDD=10, VSS=0, and VCM=130, and LO_Vcas is approximately 2.2V Vinp is swept from 0 to 10V (=Vindc), and Vinm=10–Vinp. FIG. 7 shows the output vs Vinp (vindc), FIG. 8 shows the output vs. common-mode reference voltage VCM, and FIG. 9 shows the transient response of the output to a square-wave input voltage with a 10 pF load on each output terminal.

In yet another embodiment of the invention, a feedback loop may be included with the aforementioned embodiments of the invention, to regulate bias currents. Since the bias current through the field transistors, and hence open-loop bandwidth will vary with the set point, the $V_{ds}$ applied across the field transistors may be adjusted to maintain a substantially constant current as the resistances of the field devices change.

Figure 10:
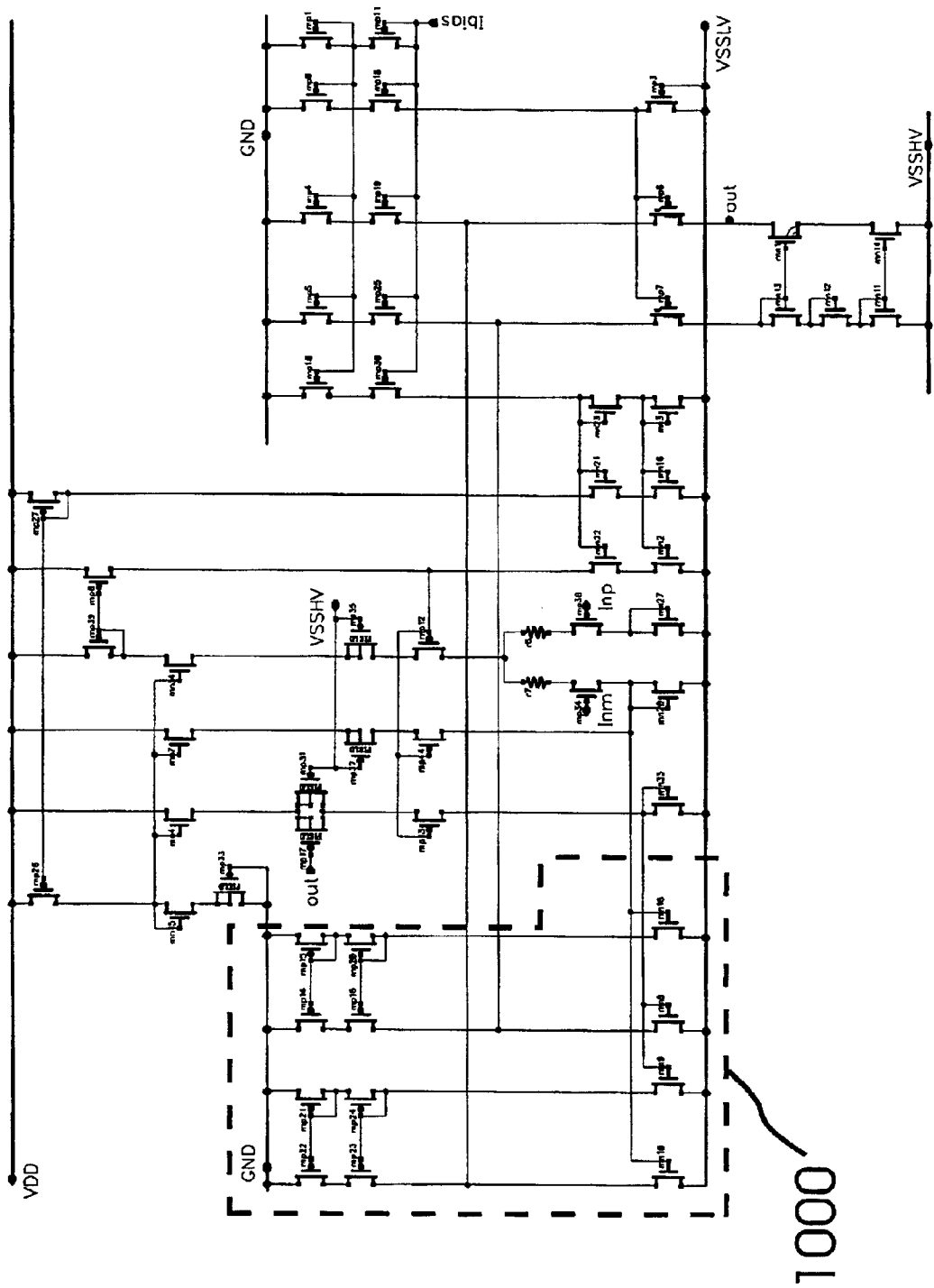
FIG. 10 shows yet another embodiment of the invention.

FIG. 10 shows yet another embodiment of the invention using current steering of a replica bias to input a control voltage and having a single-ended output. Field transistors mp35 and mp17 are made of equal size and a similar $V_{DS}$ is applied across each transistor. The gate of mp35 is connected to VSSHV, thereby providing a reference resistance across its drain and source, although it should be noted that the gate of mp35 may be connected to a different (reference) voltage other than VSSHV. The gate of mp17 is connected to the output terminal. PMOS transistors mp34, mp36, and resistors r7 and r8 comprise a current steering cell having input terminals Inm and Inp. Under normal operation, when Inm and Inp are equal the drain current through mp35 will be equally split between mn27 and mn20. NMOS transistor mn20 is a diode-connected transistor the gate of which is connected to one terminal of a current-differencing/amplification stage 1000. To balance the inputs to stage 1000, the gate of field transistor mp17, connected to the output terminal, will be driven to approximately midway between GND and VSSHV rails—causing the drain currents of mp13 and mp34 to be equal. When a differential input voltage is applied between terminals Inp and Inm, the current steering cell directs more or less of current through mn20, thereby causing the output to move in a direction to equal the amount of steered current. Transistors mp37 and mp31, which in this embodiment comprise field transistors, are made one fourth the size of mp17 and mp35, and provide a quiescent current through the input core comprising source followers mn4, mn7, mn34, mp13, mp44, mp12, mn33, and mn20.

In addition to including a current-steering input, the embodiment shown in FIG. 10 further includes a current-control feedback loop to regulate DC bias current through the field transistors, and a VT-referenced replica bias to cancel the effects of wafer to wafer variation of field threshold voltage.

The current-control feedback loop comprises transistors mp39, mp8, and mp12. Transistor mp39 mirrors the bias current through the reference field transistor mp35 to mp8, the drain of which is connected to mn22—a cascoded output of a current source. Note that mn34, a source follower, keeps the source of mp35 at a substantially constant value. The current-control feedback loop moves the gate of mp12 in a direction such that the $V_{ds}$ across mp35 causes the current flowing through mp39 to equal the current flowing through mn22 (or a ratio thereof if mp39 and mp8 are built with unequal W/L). Transistors mn7, mn4 and mp13 and mp44 set a $V_{ds}$ across the other field transistors approximately equal to the $V_{ds}$ across reference transistor mp35.

The VT-referenced replica bias comprises transistor mp33, mn15, mn4, mn7, and mn34. Transistor mp26 provides a small current through diode-connected field transistor mp33 causing the source of mp33 to become VT plus a small additional voltage, VDSAT. Diode connected NMOS mn15 then sets up a gate voltage on mn4, mn7, and mn34 such that the sources of these devices present a voltage to the sources of the field transistors mp17, mp31, mp37, and mp35 approximately a VT above the GND node. Thus, the field devices all start to turn on, or in this case invert, with a gate voltage approximately equal to GND, thereby attenuating the effects of threshold voltage on the amplifier output. For the present embodiment, exemplary voltages for the power supplies are: VDD=20V, GND=0V, VSSLV=−10V, VSSHV=−200V, Ibias=20 u.

Other embodiments of the invention include, without limitation, a class-AB high-voltage output stage, thereby allowing a smaller quiescent current, and providing for improved settling. Class-AB design techniques are well-known by those skilled in the art. In another differential embodiment, two field transistors may be connected to provide a measurement of both common-mode and differential-mode voltages to permit a differential voltage about a common-mode setpoint to be maintained—for example by adding (for common-mode) and subtracting (for differential-mode) currents produced through two cascoded field-transistors connected to the output terminals. Note that the choice of NMOS- or PMOS-type field transistors will depend on the particular application, and the present invention anticipates use of either type or a combination thereof. In yet another embodiment of the invention, the drain-source voltage across the field device may be controlled by, or further include, a higher-impedance device or circuit in certain cases where a compression, or softening, of the field-device transfer function is desired. Examples of higher-impedance devices include, for example, a resistor in series with the cascode devices, or a MOSFET in triode region.

The foregoing detailed description of the invention has been presented for purposes of illustration and description. It is not intended to be exhaustive or to limit the invention to the precise form disclosed. Many modifications and variations are possible in light of the above teaching. For example, a high-voltage amplifier with a gain may be attained using only one field transistor: e.g. a further embodiment of the invention includes replacing input transistor 212 with a low-voltage thin gate oxide transistor. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A circuit for quantifying a high-voltage signal comprising:
   a first terminal having a first voltage;
   an output terminal;
   a field transistor having a drain, a gate, and a source, said gate connected to said first terminal, said drain and source having a second and third voltage, said output terminal coupled to said field transistor, the field transistor having a gate oxide separating said source and said drain regions and said gate, said oxide has a thickness greater than a maximum thickness available to other devices on an integrated circuit chip on which the circuit is manufactured;
   wherein said output terminal provides a signal representative of said first voltage.

2. The circuit as defined in claim 1 wherein said field transistor further comprises:
   a polysilicon gate; and
   wherein said gate oxide is formed during a LOCOS step including a masked region masked by silicon-nitride, said gate oxide formed in a region absent of silicon-nitride.

3. The circuit of claim 2 wherein said gate oxide has a thickness of at least 0.1 micron.

4. The circuit of claim 2 wherein said gate oxide has a thickness of at least 0.5 micron.

5. The circuit as defined in claim 2 wherein said field transistor further includes a drain extension region formed under said gate oxide by a dopant species introduced before said LOCOS step.

6. The circuit of claim 1 wherein said field transistor comprises a metal gate layer deposited over a thermal oxide.

7. The circuit of claim 1 wherein said field transistor comprises a metal gate transistor in which the metal gate is formed over an active region and a thick, oxide layer deposited as a pre-metal dielectric after poly deposition above the active region.

8. The circuit as defined in claim 7 wherein said field transistor further includes a drain extension region formed under said active region by a dopant species implanted into said active region.

9. The circuit of claim 1 wherein said field transistor comprises a metal gate transistor in which the metal gate is formed over a deposited oxide which lies upon a LOCOS oxide.

10. The circuit as defined in claim 1 wherein said field transistor comprises a NMOS transistor.

11. The circuit as defined in claim 1 wherein said field transistor comprises a PMOS transistor.

12. The circuit as defined in claim 1 wherein said field transistor is formed over a n-type region.

13. The circuit as defined in claim 1 wherein said field transistor is formed over a p-type region.

14. The circuit as defined in claim 1 wherein said signal representative of said first voltage is a voltage signal.

15. The circuit as defined in claim 1 wherein said signal representative of said first voltage is a current.

16. The circuit of claim 1 further including a low-voltage input, wherein said first terminal includes an amplified representation of said low-voltage input.

17. The circuit of claim 1 further including:
   a reference circuit;
   a current-steering circuit having an input and an output coupled to said reference circuit.

18. The circuit of claim 17 wherein the reference circuit includes at least a second field transistor.

19. A circuit, comprising:
   at least one low voltage input;
   a first high voltage terminal; and
   a first field transistor having a source, a drain and a control region, operable within a triode region;
   wherein said control region is coupled to said first high voltage terminal.

20. The circuit of claim 19 wherein said circuit further includes a second field transistor coupled to said first field transistor.

21. The circuit of claim 20 wherein each field transistor includes a cascode transistor coupled thereto.

22. The circuit of claim 20 wherein each field transistor has a width, and wherein said second field transistor has a width which is greater than the width of the first field transistor.

23. The circuit of claim 22 wherein the width of the second field transistor is about 10 times greater than that of the first field transistor.

24. The circuit of claim 20 further including a current-differencing circuit coupled to said first field transistor and said second field transistor, said current-differencing circuit having an output.

25. The circuit of claim 24 further including a trans-impedance stage having an input and an output, said trans-impedance stage input coupled to said current-differencing circuit output.

26. The circuit of claim 24 said current-differencing circuit further including:
    a first input current;
    a second input current;
    wherein said output of said current-differencing circuit includes an amplified signal representative of the difference between said first input current and said second input current.

27. The circuit of claim 19 wherein said first field transistor comprises a NMOS transistor.

28. The circuit of claim 19 wherein said first field transistor comprises a PMOS transistor.

29. The circuit of claim 19 wherein the oxide has a thickness of at least 1000 Angstroms.

30. The circuit of claim 19 further including a second field transistor, each field transistor having coupled thereto a cascode transistor and a mirror transistor, wherein each field transistor is coupled to a first rail and each mirror transistor is coupled to a second rail.

31. The circuit of claim 30 wherein each field transistor further comprises a width and a drain current, and the width of the second field transistor is greater than that of the first field transistor, such that a bias applied to the cascade transistors generates a gain between said drain currents dependent upon the ratio of the width of the second transistor to the first transistor.

32. The circuit of claim 30 wherein said first high voltage terminal has a swing of at least 40 v.

33. The circuit of claim 30 wherein an input voltage to said circuit has a swing of no greater than 15 v.

34. The circuit of claim 19 further including a second field transistor, each field transistor having coupled thereto a cascode transistor and a mirror transistor, wherein each field transistor is coupled to a first rail and each mirror transistor is coupled to a second rail and the gate of each cascode transistor is coupled to a cascode voltage.

35. The circuit of claim 34 wherein the mirror transistor coupled to the first field transistor is a diode connected input to a current mirror.

36. The circuit of claim 35 wherein the second field transistor is connected to a mirror output.

37. The circuit of claim 19 wherein said first high voltage terminal includes an amplified representation of said low voltage input.

38. The circuit of claim 19, further including:
    a second high voltage terminal; and
    a differential mode feedback circuit.

39. The circuit of claim 38 wherein the voltage between said first high voltage terminal and said second high voltage terminal includes an amplified representation of said low voltage input.

40. The circuit of claim 38 further including a common mode feedback circuit.

41. The circuit of claim 19 further including
    a reference circuit;
    a current-steering circuit having an input and an output.

42. The circuit of claim 41 wherein said current-steering circuit further includes a coupling from said low-voltage input to said input, and said current steering circuit is coupled to said reference circuit.

43. The circuit of claim 41 wherein said reference circuit further includes a second field transistor having a gate and a reference voltage connected to said second field transistor gate.

44. The circuit of claim 41 further including a differencing circuit having a first input, a second input, and an output, said first input coupled to said first field transistor and said second output coupled to the output of said current-steering circuit.

45. The circuit of claim 19, further comprising at least one MEMS mirror coupled to said high-voltage terminal.

* * * * *